United States Patent [19]

Elabd

[11] Patent Number: 5,420,534
[45] Date of Patent: May 30, 1995

[54] PROGRAMMABLE NXM SWITCHING SYSTEM WITH CHARGE-COUPLED DEVICE MULTIPLEXER

[75] Inventor: Hammam Elabd, Sunnyvale, Calif.

[73] Assignee: Loral Fairchild Corporation, Syosset, N.Y.

[21] Appl. No.: 144,228

[22] Filed: Oct. 27, 1993

[51] Int. Cl.⁶ .................................. H03K 17/693
[52] U.S. Cl. ...................... 327/404; 327/403; 327/416; 370/68; 370/112
[58] Field of Search ............... 307/242, 243, 244, 304, 307/571; 328/103, 152; 370/68, 112; 327/403, 404, 407, 408, 415, 416, 566, 427

[56] References Cited

U.S. PATENT DOCUMENTS

| | | | |
|---|---|---|---|
| 3,812,294 | 5/1974 | Pedersen | 370/65 |
| 3,914,748 | 10/1975 | Barton et al. | 340/173 R |
| 3,947,698 | 3/1976 | Cheek, Jr. et al. | 377/57 |
| 4,103,109 | 7/1978 | Maeding | 370/112 |
| 4,157,458 | 6/1979 | Roche | 370/112 |
| 4,211,937 | 7/1980 | Kohyama | 307/221 D |
| 4,399,458 | 8/1983 | Berry et al. | 358/113 |
| 4,628,347 | 12/1986 | Sato et al. | 358/39 |
| 4,648,072 | 3/1987 | Hayes et al. | 365/454 |
| 4,669,055 | 5/1987 | Berger et al. | 364/829 |
| 4,831,621 | 5/1989 | Coutures | 370/114 |

Primary Examiner—Terry D. Cunningham
Attorney, Agent, or Firm—Perman & Green

[57] ABSTRACT

A programmable analog N×M switching network that includes a charge-coupled-device (CCD) multiplexer switch means having a plurality of N input leads. The input leads contain signals from typical devices such as video cassette recorders, televisions, video cameras, cable TV telephones or the like. The CCD multiplexer switch means also includes a plurality of M output leads that provide signals to other typical devices which also may be video cassette recorders, televisions, telephones, etc. A programmable read-only memory (PROM) clock generator provides signals to CCD gates in the CCD multiplexer switch means to enable the multiplexer switch means 10 to selectively connect the input signals and leads to the output leads. The programmable PROM is controlled by means of programming request means which may be a computer or an operator console. In the operation of the system anyone of N input signals on the N input leads from N devices can be selectively modulated and connected to any one of the M output leads to M devices by means of an analog multiplexer circuit under the control of clock signals from a PROM device which are selected by a programming request means.

7 Claims, 5 Drawing Sheets

FIG. I.

INPUT TO OUTPUT DELAY

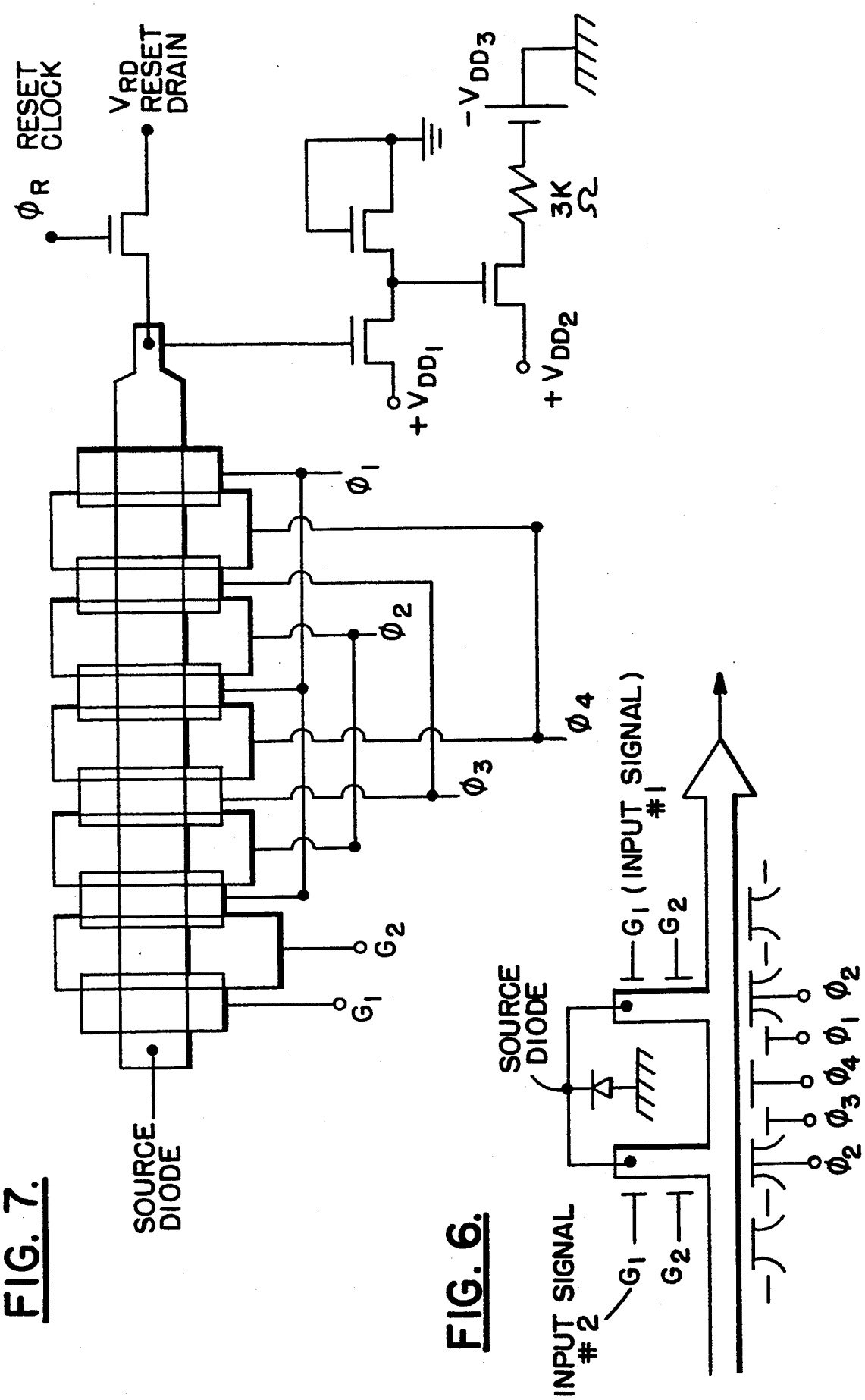

PROGRAMMABLE NXM SWITCHING SYSTEM WITH CHARGE-COUPLED DEVICE MULTIPLEXER

BACKGROUND OF THE INVENTION

1. Field of the Invention

The present invention relates to multiplex switching networks, and more particularly to a programmable analog multiplex switching network with a charge-coupled-device switching means.

2. Background Art

U.S. Pat. No. 3,740,480 issued Jun. 19, 1973 to Krupp et al. entitled TIME DIVISION MULTIPLEX SWITCHING SYSTEM UTILIZING ALL TIME DIVISION TECHNIQUES discloses time slot interchangers in each of plural input time division multiplex signal paths to a switching network shift input time slot signals to respective operational time slots corresponding to different switching circuits. A mass serial-parallel converter takes all of the input path signals from the mentioned interchangers in each time slot and steers them in series to switching circuit corresponding to that operational time slot. Further, time slot interchangers shift the signals in the respective switching circuits to new time slot positions corresponding to different output circuits. Another converter steers the new time slot signals from all of the switching circuits in series to the output circuit corresponding to that new time slot. Finally, time slot interchangers in each of the output circuits to destination time slot positions thereby completing both the line switching and the time slot interchanging operations.

U.S. Pat. No. 3,740,480 is distinct from the present invention in that it describes a switching system and merely mentions charge coupled device (CCD) technology without describing how this switching system can be realized in CCD architecture. The schematic and circuit diagram describe digital, e.g. CMOS implementation of the switching circuit. No mention of analog signal switching network or method of realization is included.

U.S. Pat. No. 4,154,986, issued May 15, 1979 to Howells et al. entitled TIME SLOT INTERCHANGE NETWORK describes a time slot interchanging network for use in digital switching. Two shift registers are used, one coupled to receive information from the incoming highway, the other coupled to feed information to the outgoing highway. The shift registers are identical in bit capacity and coupled in parallel. A circulating memory operative at the clock rate of the registers is synchronized with the incoming register to control transfer gates feeding the outgoing register.

U.S. Pat. No. 4,154,986 is distinct from the present invention in that it covers digital sort/sequence network where each pixel in a charge coupled device (CCD) implementation stores a 1 or 0 state of a bit; not analog video/or Analog Telephony signals. It describes selective transfer between two CCD registers using timed transfer gate control pulses.

U.S. Pat. No. 4,399,458 issued Aug. 16, 1983 to Berry et al. entitled SIGNAL PROCESSING SYSTEM relates to a signal processing system having an analogue shift register of the charge coupled type fed from a sampling device and controlled by a clock arrangement having three independent clocks. One clock determines the sampling rate of sampling device and the rate at which such samples are clocked into register. Another clock determines the rate at which stored samples are clocked out of the register. The two clocks operate in the MHz range. The third clock operates in the KHz range and dictates the sample storage interval and clocks the stored samples through a number of storage sites in register during the storage interval to reduce the adverse effects of geometrical and other inhomogeneities of the individual register sites on the individual stored samples.

U.S. Pat. No. 4,399,458 is distinct from the present invention in that it only relates to charge coupled device delay time. U.S. Pat. No. 4,628,347 issued Dec. 9, 1986 to Sato et al. entitled CHARGE TRANSFER DEVICE FOR MULTIPLEXING SIGNALS relates to a charge transfer device for multiplexing signals and eliminates an output circuit and level adjusting circuit necessary for multiplexing signals in the prior art. There are provided at least two first and second transfer channels and for transferring signal charges and a third transfer channel for alternately multiplexing the signal charges which are transferred within the first and second transfer channels. To the first and second transfer channels is supplied the same transfer clock signal and to the third transfer channel is supplied a second transfer clock signal with a frequency of which is n times the transfer channels before the signals are multiplexed, a multiphase clock with different phases of the clock being applied to spatially corresponding electrodes is used in the invention. The invention can be used as a signal multiplexing charge transfer device for a color solid state image sensor which uses an image sensing element such as CCD.

U.S. Pat. No. 4,628,347 Sato et al is distinct from the present invention in that it shows 2:1 MUX by selecting one of two charge input channels and switching in onto an output channel. It does not discuss a time multiplex concept applied to the switching MUX, and does not discuss the case of multiple outputs, as well as inputs. It does not discuss issues of parallel loading stored signal thru several parallel bridges.

SUMMARY OF THE INVENTION

An object of the present invention is to provide an analog switching circuit having N input sources and M output sources using a charge-coupled-device switching device.

Another object of the present invention is to provide a switching circuit having input and output nodes that can be multiplexed in any programmable or reprogrammable fashion using charge-coupled device registers with multiple input gates.

A further object of the present invention is to provide a switching circuit including a charge-coupled-device multiplex switch wherein input nodes are routed to output nodes by charge-coupled device gates controlled by programmed clock signals.

A still further object of the present invention is to provide a switching circuit with charge-coupled-device registers wherein each injection node in each of the charge-coupled-device register is separated from the other injection node by isolation stages to reduce signal cross talk.

Still another object of the present invention is to provide a switching circuit wherein high frequency input signals are switched and routed by using a plurality of interconnected multiplex switch structures.

These and other aspects of the present invention will be apparent from the accompanying drawings and the detailed description.

BRIEF DESCRIPTION OF THE DRAWINGS

FIGS. 5, 6, and 7 are circuit diagram schematic drawings of charge-coupled device registers which may be used in the switching network of FIG. 1.

DESCRIPTION OF A PREFERRED EMBODIMENT

Figure 1:
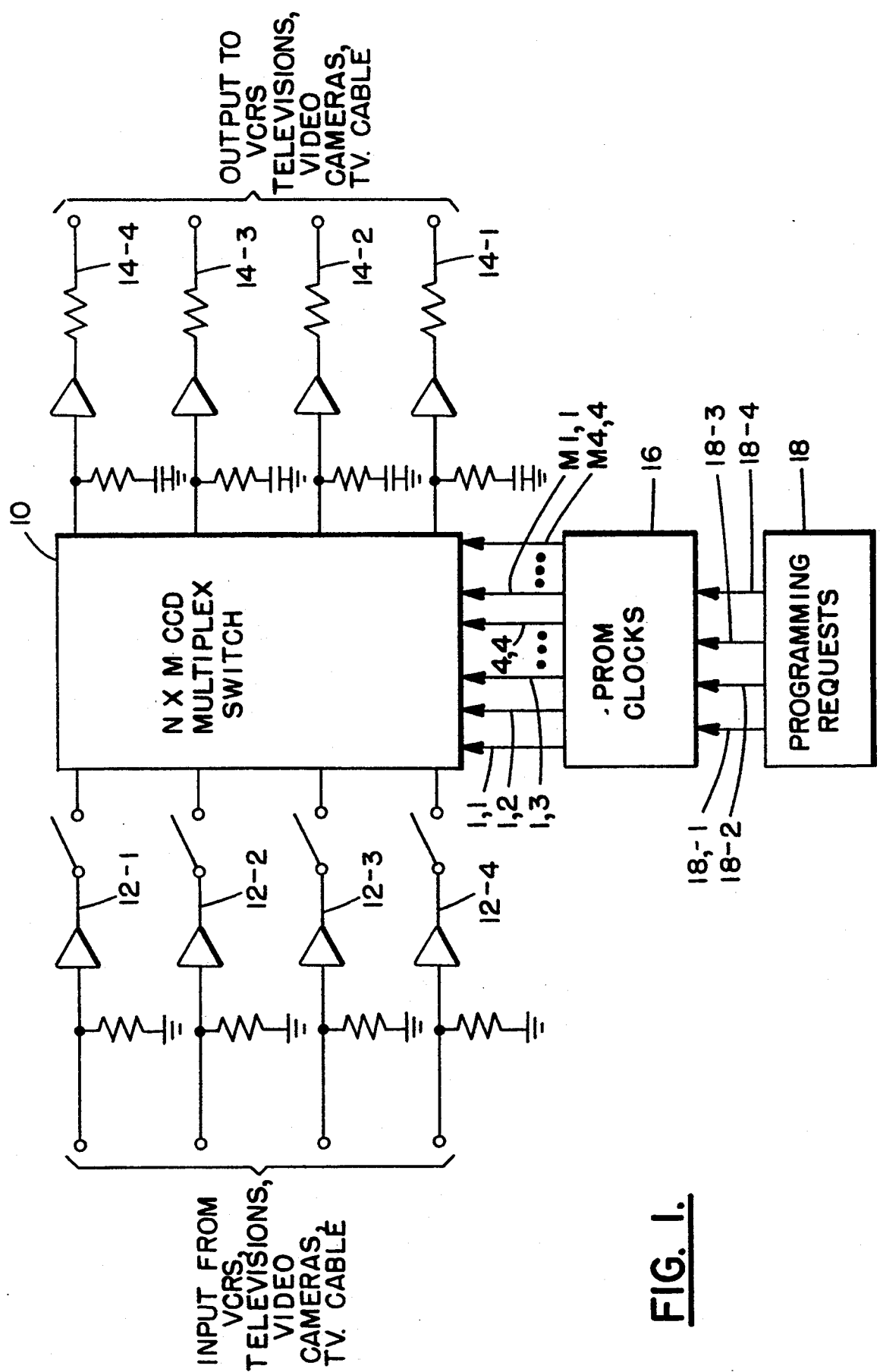
FIG. 1 is a schematic block diagram of a programmable N×M switching network according to the principles of the present invention.

Referring to FIG. 1, a schematic block diagram of a programmable N×M switching network is illustrated. For purposes of explanation the embodiment described will be a 4×4 switching system. The system of FIG. 1 includes a charge-coupled-device (CCD) multiplexer switch means 10 having a plurality, such as four input leads 12-1, 12-2, 12-3 and 12-4. The input leads 12-1 through 12-4 contain signals from typical video devices such as video cassette recorders, televisions, video cameras, cable TV or the like, although the present invention may also be employed with telephone systems therefore one or more of the input leads may be connected to telephones.

The CCD multiplexer switch means 10 also includes a plurality of output leads 14-1, 14-2, 14-3, or 14-4 that provide signals to other typical video devices which also may be video cassette recorders, televisions, etc. Both the input leads 12-1 to 12-4 and the output leads 14-1 to 14-4 contain typical buffer amplifiers and components for conventional signal shaping and processing.

A programmable read-only memory (PROM) clock generator 16 provides signals to CCD gates in CCD multiplexer switch means 10 to enable the multiplexer switch means 10 to selectively connect the input signals and leads 12-1 through 12-4 to the output leads 14-1 through 14-4. The programmable PROM 16 is controlled by means of programming request means 18 which may be a computer or an operator console. In the present embodiment of a 4×4 switch, PROM 16 provides sixteen signals (1,1), (1,2), (1,3) . . . (4,4) to the CCD multiplexer switch 10, as well as the necessary input clock signals M to modulate the CCD registers in CCD multiplex switch 10.

Figure 2:
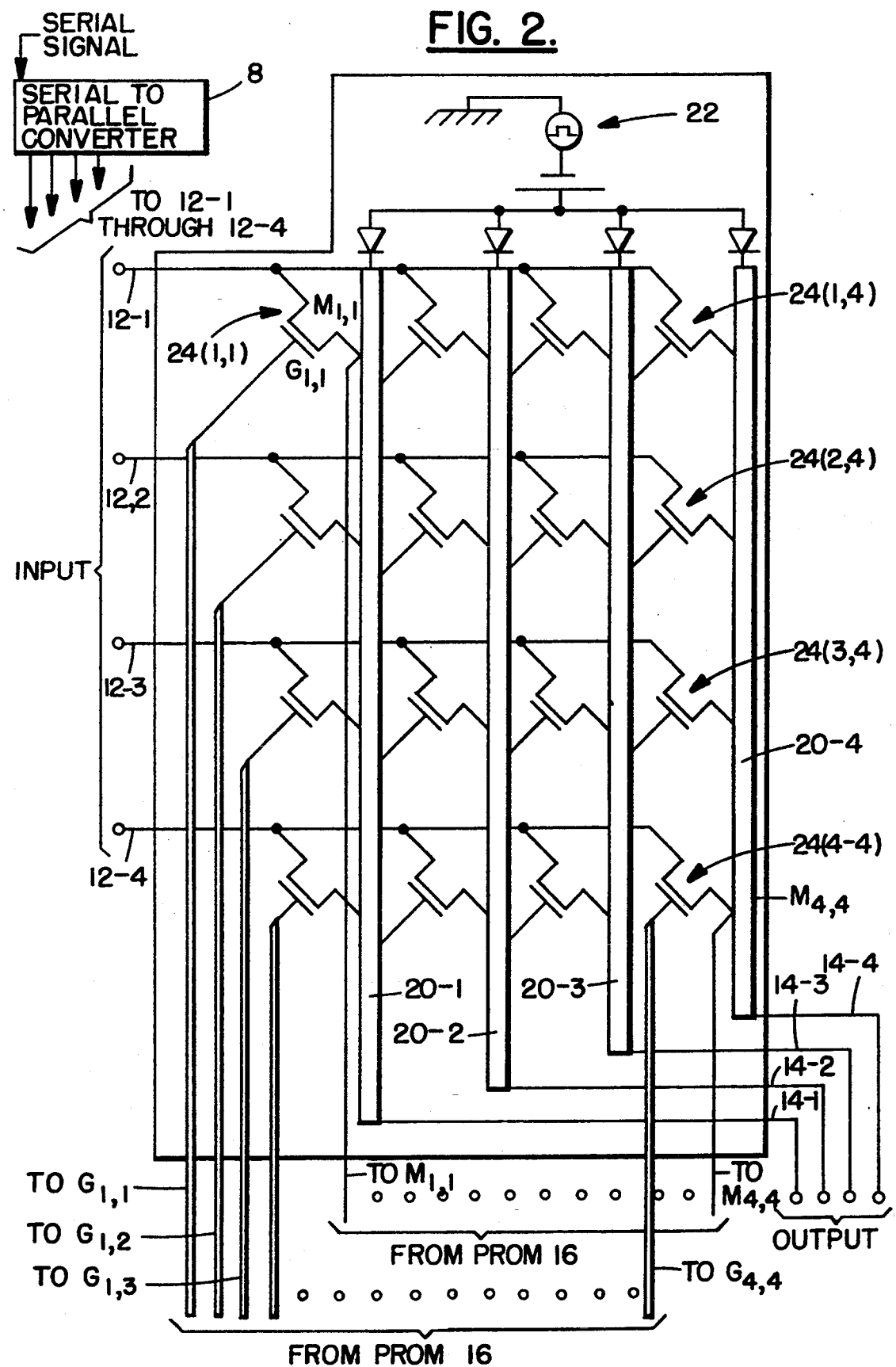
FIG. 2 is a circuit diagram of a multiplexer employed in the switching network of FIG. 1.

Referring to FIG. 2, a circuit diagram of the CCD multiplexer 10 is shown including a first plurality of lead which are the extension of the input leads 12-1, 12-2, 12-3 and 12-4.

A plurality of multiplexer CCD device channels 20-1, 20-2, 20-3 and 20-4 are connected at their input ends to one or more electron sources such as electron source 22 which introduces the charge into the CCD devices 20-1 through 20-4. The output ends of the CCD devices 20-1 through 20-4 are connected respectively to output leads 14-1 through 14-4. It is also possible to have multiple output ports from the same CCD channel to deal with time multiplexing of many signals on the same channel.

The CCD registers 20-1 through 20-4 are standard CCD devices modified only in that extra input gates, four in the present embodiment, are included in the registers.

Figure 5:
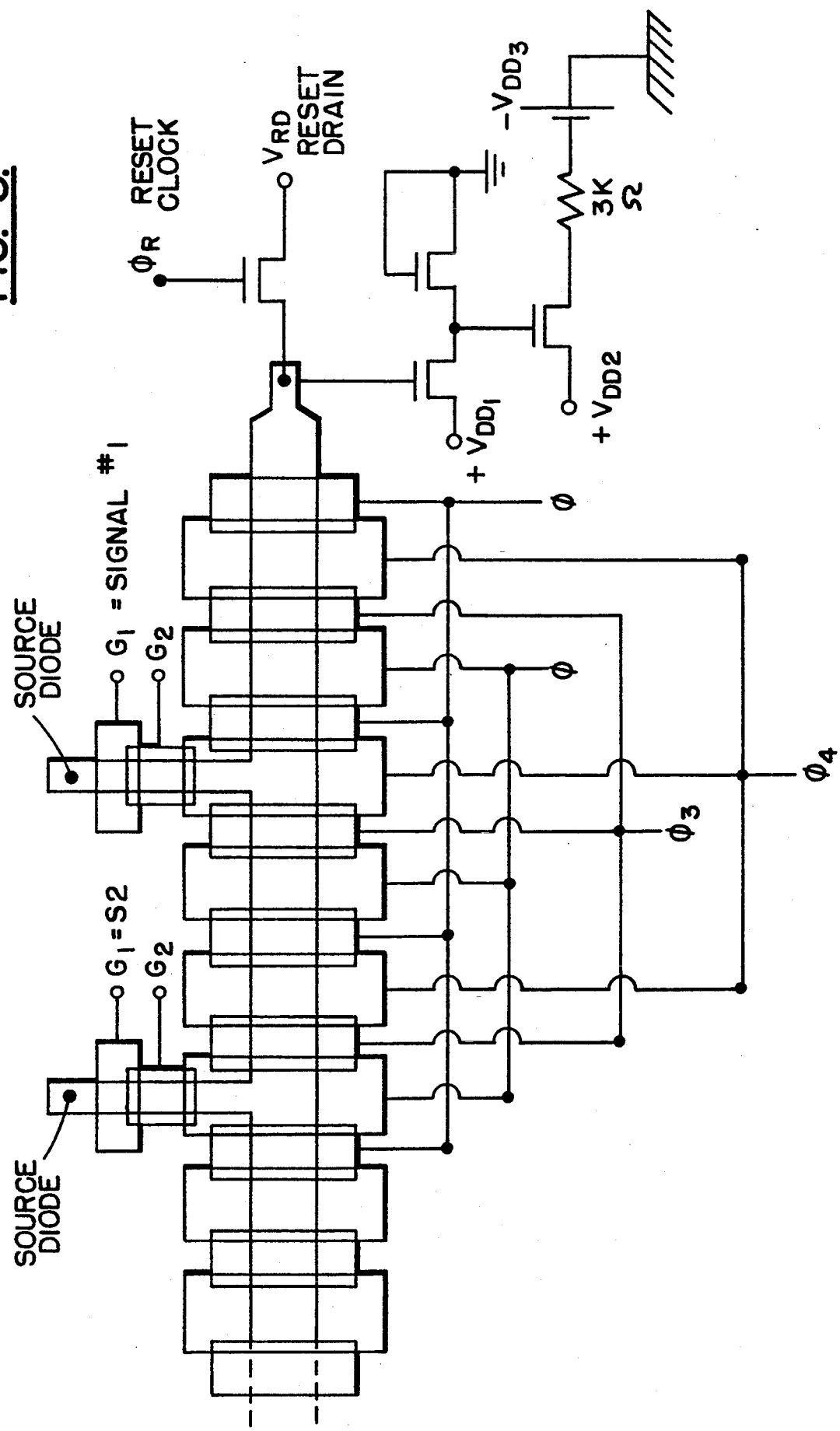

For purposes of disclosure, a typical CCD register with two injection sources and one floating diffusion detector is shown in FIG. 5 and a typical CCD register with one injection source and one floating diffusion detector is shown in FIG. 7, and will be later discussed.

Each of the input leads 12-1, 12-2, 12-3 and 12-4 are connected to each of the CCD devices 20-1, 20-2, 20-3 and 20-4 by means of transistors 24(1,1) 24(1,2), 24(1,3), 24(1,4), 24(2,1) 24(2,2) 24(2,3), 24(2,4), 24(3,1) and so on in sequence to 24 (4,4).

The gates $G_{1,1}$...$G_{4,4}$ of all the 4×4=sixteen transistors are connected to a separate programmable one of the output leads from the PROM 16.

The modulating clock signals M are connected to the phases of the CCD registers 20-1 through 20-4. The sixteen transistors 24(1,1) to 24(4,4) are selectively connected to four gates located on each of the four CCD registers or channels 20-1, 20-2, 20-3 and 20-4. More particularly, transistors 24(1,1), 24(2,1), 24(3,1) and 24(4,1) are connected to CCD register 20-1 respectively at gates M(1,1), M(2,1), M(3,1) and M(4,1). Likewise transistors 24(1,2), 24(2,2), 24(3,2) and 24(4,2) are connected to CCD register 20-2 respectively at gates M(1,2), M(2,2), M(3,2) and M(4,2). The other transistors 24(1,3) through 24(4,4) are connected in a similar sequence to gates M(1,3) through M(4,4).

In operation, a signal to a gate of a transistor such as gate $G_{1,1}$ of transistor 24(1,1) serves to connect the signal on input lead 12-1 to the gate M(1,1) of CCD register 20-1 and result in the signal on input lead 12-1 being connected onto the output lead 14-1. Similarly, a signal to gate $G_{3,3}$ of transistor 24(3,3) will connect the signal on input lead 12-3 to gate M(3,3) of CCD register 20-3 and result in the signal on input lead 12-3 being connected onto output lead 14-3. In like manner a signal on any one of the input leads 12-1, 12-2, 12-3 and 12-4 can be selectively connected to any of the output leads 14-1, 14-2, 14-3, 14-4 under the control of the signals from PROM 16 applied to the gates of the transistor 24(1,1) through 24(4,4).

The PROM 16 is controlled by programming requests from means 18 which determine the selection of the transistors 24(1,1) through 24(4,4) of the multiplexer switch 10. The programming request means 18 may provide programmed computer signals or may provide signals produced by a human operator. In the present embodiment, the output signals from programming request means 18 are binary signals on leads 18-1, 18-2, 18-3 and 18-4 which define $2^4=16$ separate commands to the PROM clock means 16 to select the sixteen separate transistors within the multiplexer switch 10 by means of the appropriate gate signal $G_{1,1}$ through $G_{4,4}$. The PROM, under the control of the programming request means 18 also provides the associated signals to the CCD register gates M(1,1) through M(4,4). The function of the signals applied to the CCD register gates M(1,1) through M(4,4) is to modulate the signals from the input leads 12-1 through 12-4 which are being switched to output leads 14-1, through 14-4.

Figure 3:
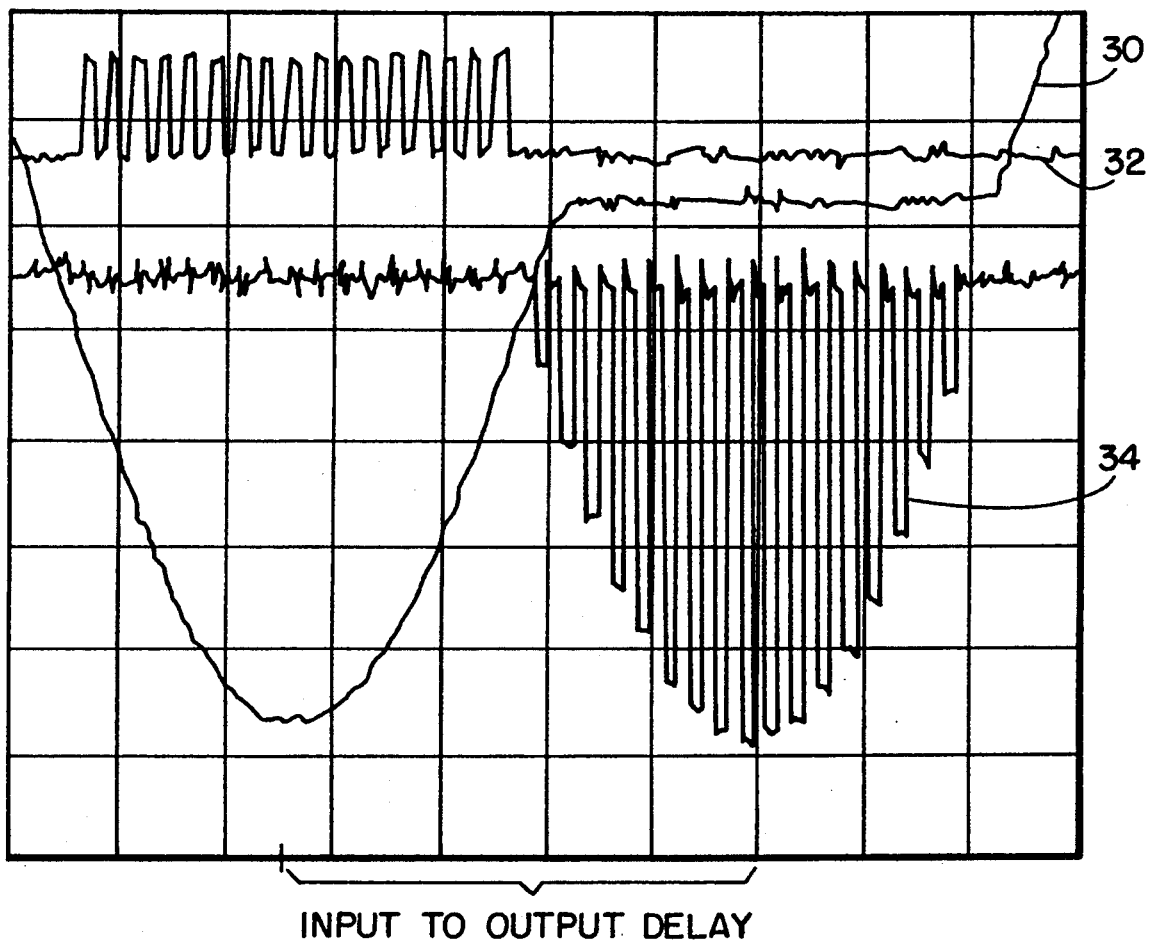
FIG. 3 is an illustration of curves representing signals actually measured on a prototype of the switching network of FIG. 1 and useful in explaining the operation of the present invention.

Referring to FIG. 3, waveforms are shown which illustrate the modulation technique and which were obtained by measurements on a prototype embodiment of the present invention. In FIG. 3, waveform 30 represents a signal on any one of the input leads 12-1 through 12-4 being applied to one of the CCD registers 20-1 through 20-4 by the selected one of the sixteen transistors in the multiplexer switch 10. Waveform 32 is the associated one of the signals $M_{1,1}$ through $M_{4,4}$ applied to the CCD register gate connected to the selected transistor. Waveform 32 is a modulating signal which interacts with the input signal 30 and provides the modulated waveform 34 which is connected as an output signal to the associated output lead 14-1 through 14-4.

Thus, what has been described is a system wherein anyone of N input signals on N input leads from N devices can be selectively modulated and connected to any one of M output leads to M devices by means of an analog multiplexer circuit under the control of clock signals from a PROM device which are selected by a programming request means.

Figure 4:
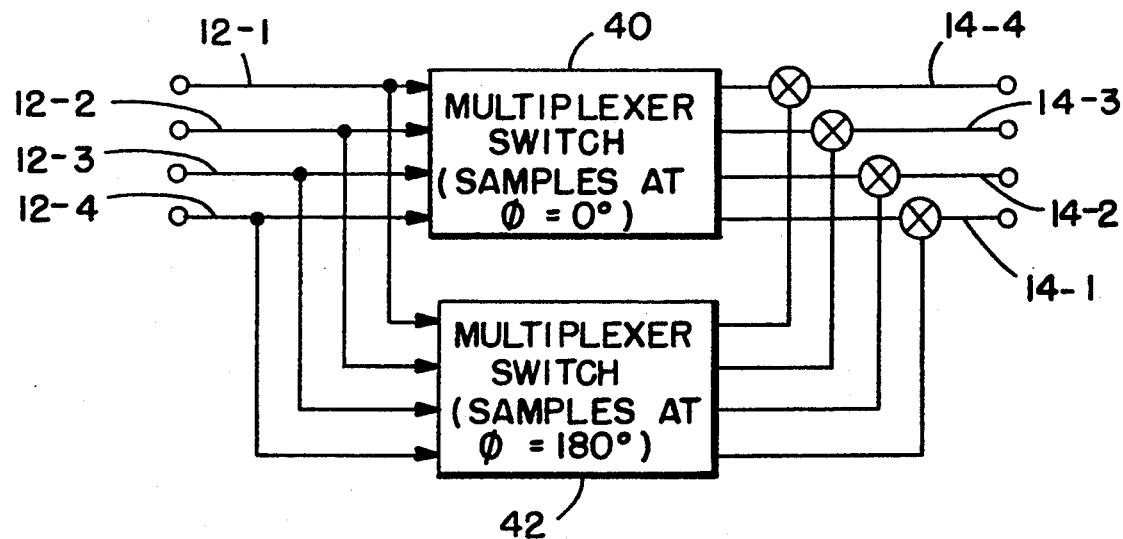
FIG. 4 is a schematic block diagram showing two multiplexers of the type shown in FIG. 1 which are connected in parallel for high frequency signal processing.

Although FIGS. 1, 2 and 4 show embodiments of the invention wherein the input signals are in parallel, one skilled in the art will appreciate that serial input signals can be used and multiplexed into parallel inputs by the use of an additional CCD register circuit used as a serial-to-parallel converter 8 as shown as an option in FIG. 2, or several parallel input signals multiplexed on the same or multiple output pins on the same CCD channel to compact data before the transmission. Series-to-parallel conversion techniques are, for example, discussed in the U.S. Pat. No. 3,740,480 patent of Krupp et al.

One of the advantages of the present invention is that it is structured to be able to handle high frequency signals not usually able to be processed by previously existing multiplexers. Referring to FIG. 4, a technique is illustrated wherein two N×M multiplexer switches 40 and 42 such as switch 10 of FIG. 1 are connected to the input leads 12-1, 12-2, 12-3, and 12-4 of FIG. 1. The input leads 12-1 through 12-4 are connected directly to the multiplexer switch 40 in a manner described for FIGS. 1 and 2. The signals on leads 12-1 through 12-4 are sampled at zero degrees by multiplexer switch 40 and are sampled at 180 degrees by phase shift by the multiplexer switch 42.

The output signals from multiplexer switches 40 and 42 are controlled by the same signals from a single PROM (not shown) such as in FIGS. 1 and 2. The output signals are the related ones of output leads 14-1A, 14-2A, 14-3A and 14-4A from multiplexer 42 are combined with output leads 14-1, 14-2, 14-3 and 14-4. If the original input signals on leads 12-1 through 12-4 are of a very high frequency, such as 80 megahertz, the two multiplexers 40 and 42 may be designed to operate at lower frequencies such as 40 megahertz.

It was previously stated that the charge-coupled device registers used in the multiplex switch of the present invention are available state-of-the art structures. In purposes of providing a complete embodiment, FIGS. 5, 6 and 7 illustrate examples os such state-of-the art charge-coupled-device registers. FIGS. 5 and 6 illustrate the structure and operation of a typical CCD register having two injection sources and one floating diffusion detector. FIG. 7 illustrates a typical CCD register having one injection source and one floating diffusion detector.

Further discussion of CCD registers is provided in the text "Charge-Transfer Devices" by G. S. Hobson, A Halsted Press Book published by John Wiley & Sons, New York. Chapter 5 of this text, pages 89-101, describes voltage to charge conversion, and injection of charge into CCD registers. In the present invention, charge may be injected in the CCD registers of the multiplex switch by using the modified fill and spill technique described on page 94 and employing the capacitive metering described on page 99. It is also possible to switch positive and negative analog signals using either offset control circuit or n and p channel control transistors.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A programmable analog multiplex structure for connecting any one N input means to any on of M output means wherein N and M are integers greater than 1 comprising:

a multiplex switch means including N input leads each receiving a respective input signal and M output leads and M charge-coupled-device registers selectively connected to said M output leads and to said N input leads via a plurality of switching means, a clock means connected to said multiplex switch means for providing clock signals to said plurality of switching means, and programming request means connected to said clock means for providing programming request data to said clock means, wherein said clock means is responsive to said programming request data for producing clock signals to selected ones of said plurality of switching means, wherein said selected ones of said plurality of switch means are responsive to said clock signals for connecting selected ones of said N input leads to selected ones of said M charge-coupled-device registers connected to said M output leads.

2. A programmable analog multiplex switch structure according to claim 1 wherein said multiplex switch means includes N×M switching devices, an individual one of said N×M switching devices connected between each of said N input leads and a respective gate of said M charge-coupled-device registers.

3. A programmable analog multiplex switch structure according to claim 2 wherein each of said plurality of switching devices is a transistor device having a first electrode connected to one of said N input leads, a second electrode connected to a gate of one of said M charge-coupled-device registers, and a gate electrode connected to said clock means and to switch in response to a signal from said clock means for connecting said one of said N input leads to said gate of said one of said charge-coupled-device registers and wherein said N input leads provide the input signals which are applied to said gates of said charge-coupled devices through said transistor devices.

4. A programmable analog multiplex switch structure according to claim 3 wherein said clock means is connected to each of said gates of said M charge-coupled-device registers, said clock means providing a carrier signal to said gates of said charge-coupled-device registers, and wherein said carrier signal is modulated by the input signal received on said input leads and connected through said transistor devices to said charge-coupled device gates when said transistor devices are switched by said signals from said clock means.

5. A programmable analog multiplex switch structure according to claim 4 wherein said input signals are in parallel and are connected to N parallel input leads.

6. A programmable analog multiplex switch structure according to claim 4 further including a serial-to-parallel converter and wherein said input signals are in series and are connected to N parallel input leads via said serial-to-parallel converter means to convert said series input signals into parallel signals.

7. A programmable analog multiplex switch structure according to claim 1 wherein said multiplex switch means includes first and second separate switch means each connected to said N input leads and to said M output leads wherein said input signals on said N input leads are high frequency of f, and wherein said first and second multiplex switch means operate at frequencies of f/2, said first multiplexed switch means operating to sample said input signals at phase equal to zero degrees and said second multiplexer switch means operating to sample said input signals at phase equal to 180 degrees.

* * * * *

UNITED STATES PATENT AND TRADEMARK OFFICE
CERTIFICATE OF CORRECTION

PATENT NO. : 5,420,534
DATED : May 30, 1995
INVENTOR(S) : Elabd

It is certified that error appears in the above-identified patent and that said Letters Patent is hereby corrected as shown below:

In col. 6, claim 3, line 58, the phrase "which are applied" should be deleted.

Signed and Sealed this

Twenty-ninth Day of August, 1995

Attest:

BRUCE LEHMAN

Attesting Officer

Commissioner of Patents and Trademarks